(12) United States Patent
Phan et al.

(10) Patent No.: US 12,197,133 B2
(45) Date of Patent: Jan. 14, 2025

(54) TOOL CONTROL USING MULTISTAGE LSTM FOR PREDICTING ON-WAFER MEASUREMENTS

(71) Applicant: International Business Machines Corporation, Armonk, NY (US)

(72) Inventors: Dung Tien Phan, Ossining, NY (US); Robert J. Baseman, Brewster, NY (US); Ramachandran Muralidhar, Mahopac, NY (US); Fateh A. Tipu, Wappingers Falls, NY (US); Nam H. Nguyen, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 865 days.

(21) Appl. No.: 16/596,732

(22) Filed: Oct. 8, 2019

(65) Prior Publication Data

US 2021/0103221 A1 Apr. 8, 2021

(51) Int. Cl.
*G03F 7/00* (2006.01)
*G05B 13/02* (2006.01)
*G06N 7/01* (2023.01)

(52) U.S. Cl.
CPC .......... *G03F 7/705* (2013.01); *G03F 7/70783* (2013.01); *G05B 13/0265* (2013.01);
(Continued)

(58) Field of Classification Search
CPC .. G03F 7/705; G03F 7/70508; G03F 7/70525; G03F 7/70616; G03F 7/70625;
(Continued)

(56) References Cited

U.S. PATENT DOCUMENTS 5,467,883 A 11/1995 Frye
7,243,441 B2 7/2007 Watanabe
(Continued)

FOREIGN PATENT DOCUMENTS

CN 101908495 12/2010
CN 101939833 1/2011
(Continued)

OTHER PUBLICATIONS

Song et al. ; "Novel Application of Deep Learning for Adaptive Testing Based on Long Short-Term Memory"; 2019 IEEE 37th VLSI Test Symposium (VTS); Conference Paper | Publisher: IEEE (Year: 2019).*

(Continued)

*Primary Examiner* — Jack Chiang
*Assistant Examiner* — Aric Lin
(74) *Attorney, Agent, or Firm* — James Olsen; Otterstedt & Kammer PLLC (57) ABSTRACT

A method for process control using predictive long short term memory includes obtaining historical post-process measurements taken on prior products of the manufacturing process; obtaining historical in-process measurements taken on prior workpieces during the manufacturing process; training a neural network to predict each of the historical post-process measurements, in response to the corresponding historical in-process measurements and preceding historical post-process measurements; obtaining present in-process measurements on a present workpiece during the manufacturing process; predicting a future post-process measurement for the present workpiece, by providing the present in-process measurements and the historical post-process measurements as inputs to the neural network; and adjusting at least one controllable variable of the manufac- (Continued)

turing process in response to the prediction of the future post-process measurement.

11 Claims, 7 Drawing Sheets

(52) U.S. Cl.
CPC ..... *G06N 7/01* (2023.01); *G05B 2219/45031* (2013.01); *G06T 2207/20081* (2013.01)

(58) Field of Classification Search
CPC . G03F 7/70783; G03F 7/70491; G06N 20/00; G06N 7/005; G06N 3/0454; G06N 3/0445; G06N 20/20; G06N 3/08; G06N 3/02; G06N 7/01; G06N 3/044; H01L 21/67253; H01L 22/00; G06F 2119/18; G05B 13/0265; G05B 2219/45031; G06T 2207/20081
See application file for complete search history.

(56) References Cited

U.S. PATENT DOCUMENTS

| | | | |
|---|---|---|---|
| 7,444,616 B2 | 10/2008 | Sandstrom et al. | |
| 7,493,185 B2 | 2/2009 | Cheng | |
| 7,656,182 B2 * | 2/2010 | Bickford | G01R 31/30 324/762.06 |
| 8,175,831 B2 * | 5/2012 | Izikson | G03F 7/70508 702/82 |
| 8,437,870 B2 * | 5/2013 | Tsai | H01L 22/12 703/2 |
| 9,606,453 B2 | 3/2017 | Izikson et al. | |
| 9,792,393 B2 * | 10/2017 | Tetiker | G03F 1/80 |
| 10,192,146 B2 | 1/2019 | Sen et al. | |
| 11,120,182 B2 | 9/2021 | Lin | |
| 2004/0040001 A1 | 2/2004 | Miller | |
| 2010/0138026 A1 * | 6/2010 | Kaushal | G06N 5/04 706/23 |
| 2011/0131162 A1 * | 6/2011 | Kaushal | G05B 13/0265 706/13 |
| 2012/0218533 A1 | 8/2012 | Lyulina et al. | |
| 2014/0236515 A1 | 8/2014 | Ho | |
| 2015/0369857 A1 * | 12/2015 | Nakamura | H01L 22/20 324/750.05 |
| 2016/0292342 A1 | 10/2016 | Han | |
| 2017/0363950 A1 * | 12/2017 | Sriraman | G03F 1/80 |
| 2018/0157161 A1 * | 6/2018 | Mailfert | G06F 30/367 |
| 2018/0284621 A1 * | 10/2018 | Hulsebos | G03F 9/7003 |
| 2018/0314148 A1 * | 11/2018 | Tetiker | G03F 1/36 |
| 2018/0349535 A1 * | 12/2018 | Bhosale | G06N 5/025 |
| 2018/0349538 A1 * | 12/2018 | Bhosale | G06F 30/398 |
| 2018/0356807 A1 | 12/2018 | Honda et al. | |
| 2019/0049937 A1 * | 2/2019 | Tetiker | G06F 30/398 |
| 2019/0095797 A1 * | 3/2019 | Dhandapani | B24B 37/20 |
| 2019/0172312 A1 * | 6/2019 | Shigeta | G07F 17/3209 |
| 2019/0295890 A1 | 9/2019 | Clark | |
| 2020/0083080 A1 * | 3/2020 | Clark | H01L 21/67023 |
| 2021/0103221 A1 * | 4/2021 | Phan | G06N 3/0445 |
| 2021/0241137 A1 * | 8/2021 | Jain | G16H 40/67 |
| 2021/0335638 A1 * | 10/2021 | Manassen | H01L 21/67253 |
| 2022/0066411 A1 * | 3/2022 | Ummethala | G05B 19/401 |

FOREIGN PATENT DOCUMENTS

| | | | | |
|---|---|---|---|---|
| CN | 103310285 | | 9/2013 | |
| CN | 104658962 | A | 5/2015 | |
| CN | 106158679 | | 11/2016 | |
| CN | 106158679 | A | 11/2016 | |
| EP | 0602855 | A1 | 6/1994 | |
| EP | 3650939 | A1 * | 5/2020 | |
| JP | H06348679 | A | 12/1994 | |
| JP | 2004157029 | A | 6/2004 | |
| JP | 2005150340 | A | 6/2005 | |
| JP | 2005536887 | A | 12/2005 | |
| JP | 2006024195 | A | 1/2006 | |
| JP | 2006506800 | A | 2/2006 | |
| JP | 2006157029 | A | 6/2006 | |
| JP | 2019047100 | A | 3/2019 | |
| TW | 202036357 | A * | 10/2020 | G06K 9/6231 |
| WO | 2003081663 | A2 | 10/2003 | |
| WO | 2004019401 | A1 | 3/2004 | |
| WO | WO2009029851 | A2 | 3/2009 | |
| WO | WO-2018101722 | A2 * | 6/2018 | G05B 15/02 |

OTHER PUBLICATIONS

Wang, Xueting, International Search Report and Written Opinion, PCT/IB2020/058381, Dec. 16, 2020, pp. 8.

Zhang et al., "Long short-term memory for machine remaining life prediction", Journal of Manufacturing Systems, vol. 48, part C, Jul. 2018, pp. 78-86, https://www.sciencedirect.com/science/article/pii/S0278612518300803.

Salinas et al., "DeepAR: Probabilistic Forecasting with Autoregressive Recurrent Networks", Feb. 2019, 12 pages, https://arxiv.org/pdf/1704.04110v3.pdf.

Bayer et al., "Learning Stochastic Recurrent Networks", Mar. 2015, 9 pages, https://arxiv.org/pdf/1411.7610v3.pdf.

Kingma et al., "Auto-Encoding Variational Bayes", May 2014, 14 pages, https://arxiv.org/pdf/1312.6114v10.pdf.

J D Williams, European Patent Attorney, counterpart Application No. GB2205127.0. In response to the Examination Report, Jun. 13, 2023, pp. 5.

Office Action in Counterpart Chinese Application, in Chinese language, dated May 9, 2023, 5 pages, total, page 4 shows "A" category of cited references.

Patent examiner: Shoji. Decision to Grant a Patent. Counterpart Japanese Patent Application number: Japanese Patent Application No. 2022-521521. Apr. 6, 2024. pp. 2.

* cited by examiner

TOOL CONTROL USING MULTISTAGE LSTM FOR PREDICTING ON-WAFER MEASUREMENTS

The invention disclosed and claimed herein was made as a result of activities undertaken within the scope of a joint research agreement (JRA) between International Business Machines Corporation of Armonk, New York and Applied Materials, Inc. of Santa Clara, California.

BACKGROUND

The present invention relates to the electrical, electronic, and computer arts, and more specifically, to manufacturing semiconductor devices.

In semiconductor manufacturing, on-wafer measurements are important for controlling process tools. Such measurements rely on physical variables such as trace sensor data coming from different tools. However, key measurements can be taken only after a wafer has been fully fabricated. The observations from an in-process sensor network, including the measurements of key state variables that contribute to the post facto wafer thickness, are a stochastic process due to the aleatoric variability, such as sensor noise, natural variability in the materials, mechanical noise, and so on. Reliably predicting an on-wafer measurement (i.e. approximating an actual value of wafer thickness that screens out the stochastic noise, in a manner more precise and accurate than currently achievable) is an important challenge.

There are a few deep learning models for modelling time series data. However, none of those can be applied efficiently for semiconductor problems. For example, there is a large volume of literature regarding statistics models for state identification and forecast of time series data, such as ARMAX and dynamic linear models, extended Kalman filters, and so on. Most of the previous statistical models are based on a linearization or a Gaussian distribution assumption.

SUMMARY

Principles of the invention provide techniques for tool control using a multistage LSTM for predicting on-wafer measurements. In one aspect, an exemplary method for controlling a manufacturing process in real-time during a current process step of the manufacturing process includes obtaining historical post-process measurements taken on prior products of the manufacturing process, and obtaining historical in-process measurements taken on prior workpieces during prior iterations of the current process step. (The method also includes training a neural network by using training data taken from historical post-process measurements and the associated historical in-process measurements.) The method then includes obtaining present in-process measurements on a present workpiece during the current process step; predicting a future post-process measurement for the present workpiece, by providing the present in-process measurements and the historical post-process measurements as inputs to the neural network; and adjusting at least one controllable variable of the manufacturing process in response to the prediction of the future post-process measurement.

One or more embodiments of the invention or elements thereof can be implemented in the form of a computer program product including a computer readable storage medium with computer usable program code for facilitating the method steps indicated. Furthermore, one or more embodiments of the invention or elements thereof can be implemented in the form of a system (or apparatus) including a memory that embodies computer executable instructions, and at least one processor that is coupled to the memory and operative by the instructions to facilitate exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a tangible computer readable storage medium (or multiple such media) and implemented on a hardware processor, or (iii) a combination of (i) and (ii); any of (i)-(iii) implement the specific techniques set forth herein.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

In view of the foregoing, techniques of the present invention can provide substantial beneficial technical effects. For example, one or more embodiments provide one or more of:

Reliable prediction of wafer thickness or resistivity during wafer fabrication, thereby enabling in-process tool control to adjust the thickness of a finished wafer in real time.

Reliable prediction of a post-process measurement in real-time during a manufacturing process, thereby enabling in-process tool control to adjust the post-process measurement.

Fabrication of wafers with improved consistency of wafer thickness and other post-process measurements, based on ability to adjust process in real-time in response to reliable predictions of post-process measurements, thus resulting in higher-quality wafers and higher-quality integrated circuits as compared to prior-art techniques.

These and other features and advantages of the present invention will become apparent from the following detailed description of illustrative embodiments thereof, which is to be read in connection with the accompanying drawings.

DETAILED DESCRIPTION

One or more embodiments relate to a predictive model for use in semiconductor manufacturing to forecast a post-process on-wafer measurement by leveraging historical wafer measurements and in-process sensor data. Exemplary in-process sensor data includes temperature, pressure, plasma flow rate, current, and voltage. In one or more embodiments, the underlying model is a probabilistic multi-stage Long short-term memory (LSTM) system that can sample predictions from a mixed Gaussian probability distribution. By forecasting the post-process measurement during the process, embodiments of the invention enable real-time tool control to adjust the post-process measurement in response to in-process signals related to other variables.

Aspects of the invention include developing a deep learning based predictive model for post-process measurements. In one or more embodiments, the predictive model combines in-process sensor data with a history of post-process measurements, via a multi-layered LSTM architecture, in order to predict the post-process measurement for a current process iteration. In one or more embodiments, the predictive model models the output of the LSTM network as a conditional Gaussian mixture.

In one or more embodiments, the predictive model employs a random sampling method (e.g., Monte Carlo sampling) for the forecast of the probability distribution, then sends the predicted probability density function to the process control system or the control operator for control action. In one or more embodiments, control action includes adjusting one or more process parameters based on optimizing the most likely predicted measurement. Exemplary process parameters (controllable variables) include duration of deposition process; deposition temperature; plasma flow rate; plasma generator voltage or current.

Figure 1:
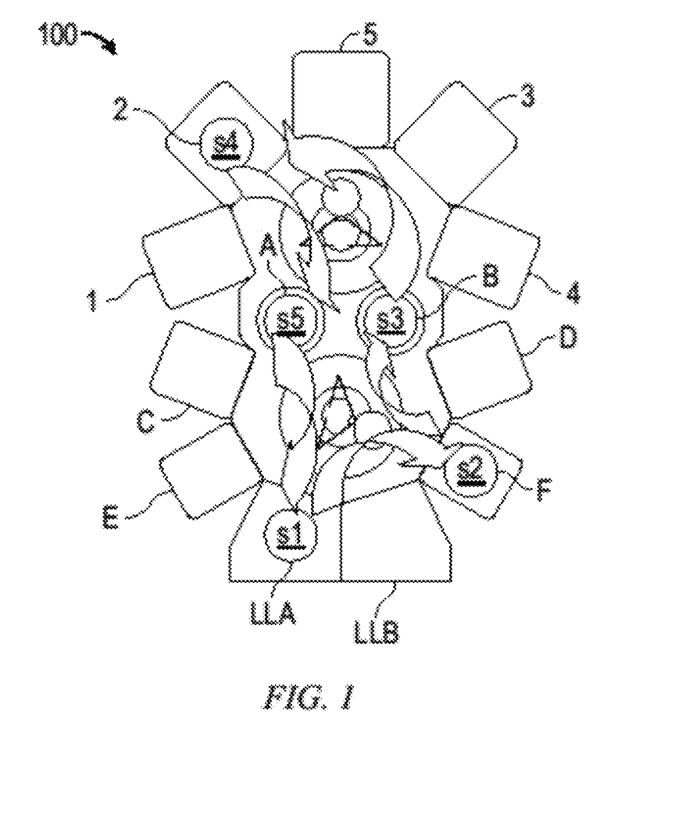
FIG. 1 depicts in a schematic an exemplary manufacturing process flow to which exemplary embodiments are applicable.

Turning now to the drawings, FIG. 1 depicts an exemplary manufacturing process flow 100 for semiconductor wafers. Although the exemplary system fabricates semiconductor wafers, embodiments are equally applicable to other manufacturing systems; by way of non-limiting examples, steel or aluminum rolling mills, automated chemical process plants, etc.

The exemplary manufacturing process flow 100 takes place in an apparatus that includes component assemblies LLA, LLB, A, B, C, D, E, F, 1, 2, 3, 4, and 5. Although the particular functions of the component assemblies are not significant to the scope of one or more embodiments of the invention, it is noteworthy that the process flow 100 includes a step s1 that takes place in component assembly LLA, then a step s2 that takes place in component assembly F. Also included are a step s3 in component assembly B, a step s4 in component assembly 2, and a step s5 in component assembly A. After step s5 the finished wafer leaves the process flow and a post-process measurement is taken. During the various steps, in-process measurements are taken. A non-limiting example of a post-process measurement is wafer resistivity. Non-limiting examples of in-process measurements are plasma voltages, currents, temperatures, and pressures as well as elapsed time during material deposition or etch.

Figure 2:
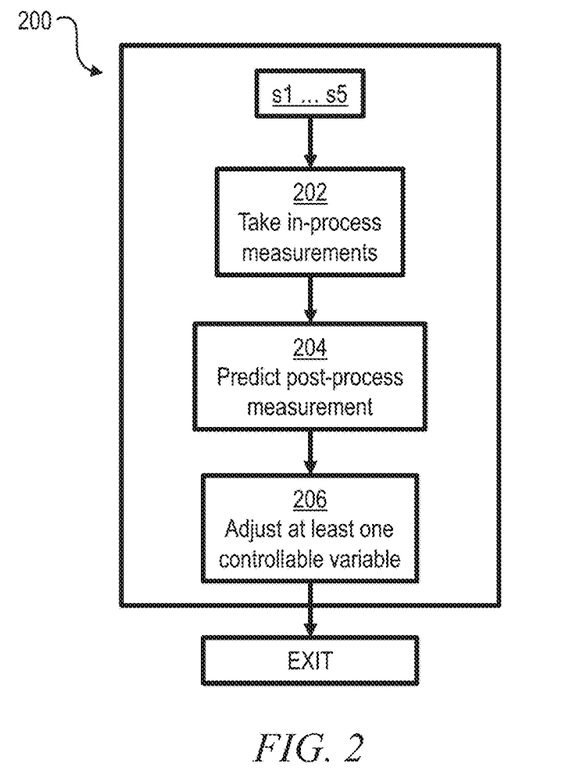
FIG. 2 depicts in a flowchart a control process according to an exemplary embodiment.

FIG. 2 depicts in a flowchart a control process 200 according to an exemplary embodiment. During each of the process steps s1 ... s5, in-process measurements are taken at 202 and the post-process measurement is predicted at 204 based on those in-process measurements. At 206, at least one controllable variable of the present process step is adjusted in response to the prediction of the post-process measurement, so as to reduce an error differential between the prediction and a target value of the post-process measurement.

Figure 3:
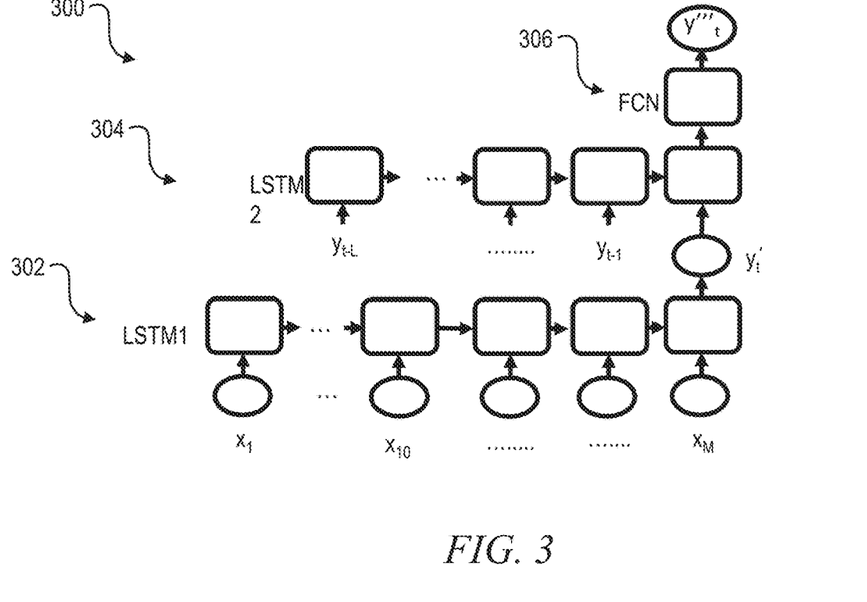
FIG. 3 depicts in a schematic a neural network according to an exemplary embodiment.

FIG. 3 depicts in a schematic a neural network 300 that is used for predicting a post-process measurement or target variable from in-process sensor signals for a single process step, according to an exemplary embodiment. For example, the single process step could be chemical vapor deposition. The neural network 300 incorporates a first LSTM layer 302 that accepts in-process sensor signals $x_1, \ldots x_{10}, \ldots x_M$ (which may be time sequenced or concurrent) and produces a naïve prediction $y_t'$ of the post-process target variable. Note that, although the drawings show 10 or more in-process sensor signals, one or more embodiments are equally functional with fewer than 10 in-process sensor signals. The network 300 also includes a second LSTM layer 304 that accepts historical measurements of the target variable $y_{t-L} \ldots y_{t-1}$, along with the current prediction $y_t'$. Optionally, the second LSTM layer 304 also accepts a history of predictions $y'_{t-L} \ldots y'_{t-1}$. The second LSTM layer 304 passes its output to a fully connected layer (FCN) 306, which produces an informed prediction $y'''_t$ as a conditional Gaussian mixture probability distribution that accounts for the history of measurements.

Figure 4:
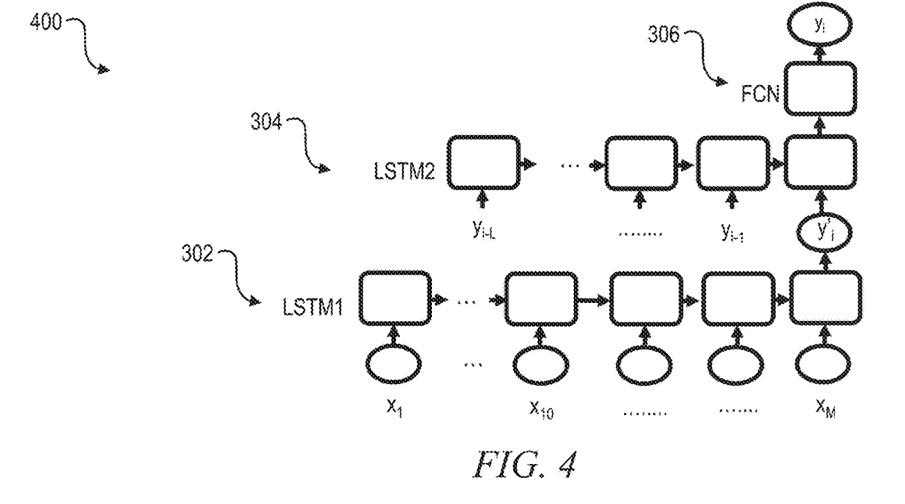
FIG. 4 depicts in a schematic a method for training the neural network of FIG. 3, according to an exemplary embodiment.

FIG. 4 depicts in a schematic 400 how the neural network 300 of FIG. 3 is trained. For the first LSTM layer 302, historical in-process measurements $X_i$ (i.e. $x_1, \ldots x_{10}, \ldots x_M$) are provided as inputs while a historical post-process measurement $y_i$ is provided as the desired output. For training the second LSTM layer 304 and the FCN 306, historical post-process measurements $y_{t-L} \ldots y_{i-1}$ and a historical post-process prediction $y_i'$ (from the first LSTM layer 302) are provided as inputs, with a historical post-process measurement $y_i$ as a desired output. In one or more embodiments, the first and second LSTM layers 302, 304 are trained together simultaneously as the time step i repeatedly scans from t−L through t−1, until the LSTM and FCN weights converge to values that produce an acceptable level of error (error differential) between the prediction $y_t'$ and the actual measured value $y_t$ at each time step. By way of non-limiting examples, an acceptable error differential might be 6%, 3%, 1%, 0.5%, or 0.01% depending on the end user's manufacturing tolerances for the target variable.

Figure 5:
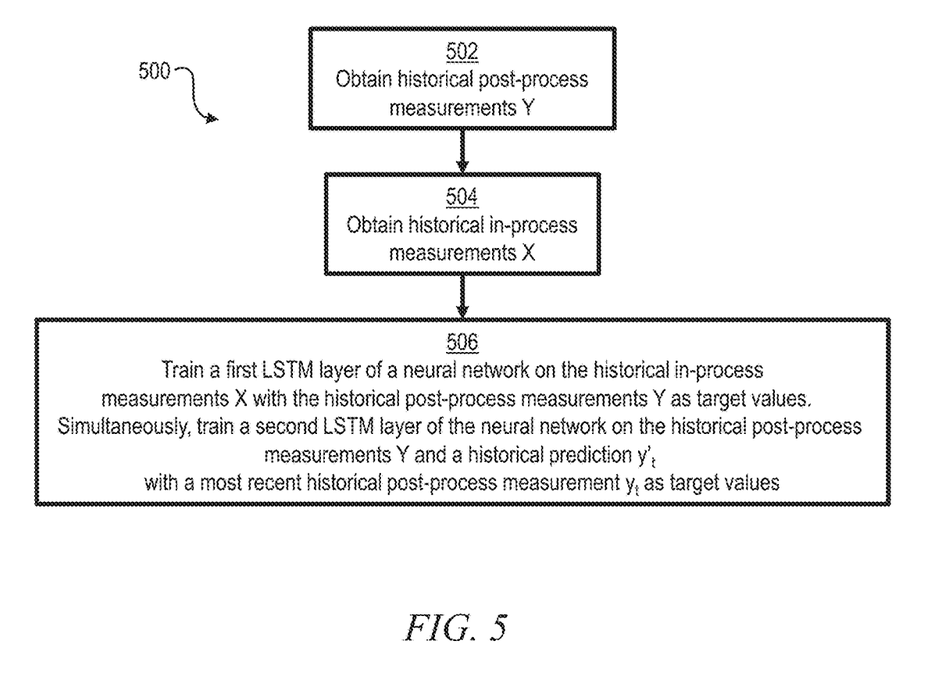
FIG. 5 depicts in a flowchart the method of FIG. 4.

FIG. 5 depicts in a flowchart a method 500 consistent with the schematic of FIG. 4. At 502, obtain historical post-process measurements Y. At 504, obtain historical in-process measurements $x_1, \ldots x_{10} \ldots x_M$. At 506, train a first LSTM layer of the neural network on the historical in-process measurements X with the historical post-process measurements $y_{t-L}, \ldots y_{t-1}$ as the target values, and, simultaneously, train a second LSTM layer of the neural network on the historical post-process measurements and a historical prediction $y'_t$ of a post-process measurement, with the most recent historical post-process measurement $y_t$ as the target value.

Figure 6:
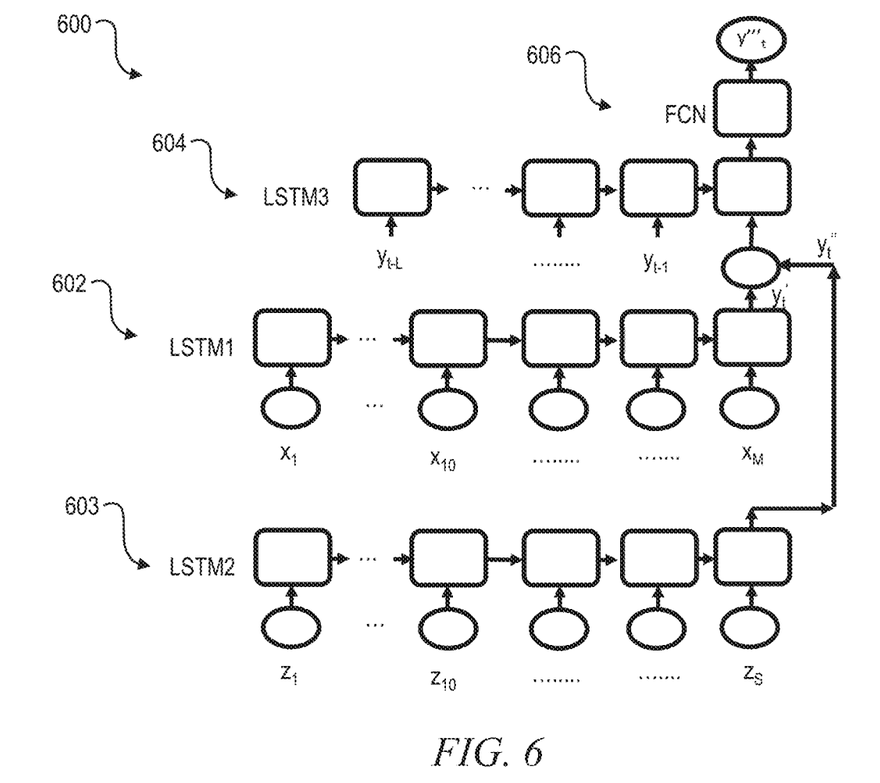
FIG. 6 depicts in a schematic a neural network according to an exemplary embodiment.

FIG. 6 depicts in a schematic a more complex neural network 600 that is used for predicting a post-process measurement or target variable from in-process sensor signals for a plurality of process steps, according to an exemplary embodiment. For example, a first process step could be plasma vapor deposition while a second process step could be atomic layer deposition. The neural network 600 incorporates a first LSTM layer 602 that receives sensor signals $x_1 \ldots x_{10} \ldots x_M$ from a first process, and a second LSTM layer 603 that accepts sensor signals $z_1 \ldots z_{10} \ldots z_S$ from a second process that runs in tandem with the first process. Note that, although the drawings show 10 or more sensor signals from the second process, one or more embodiments are equally functional with fewer than 10 in-process sensor signals. Each of the LSTM layers 602, 603 produces a respective prediction $y'_t$, $y''_t$ for the target variable. The predictions $y'_t$ and $y''_t$ are input to a third LSTM layer 604 that also takes as input a history of target variable measurements $y_{t-L} \ldots y_{t-1}$. The third LSTM layer 604 passes its output to a fully connected layer 606, which produces the final prediction $y'''_t$ as a conditional Gaussian mixture probability distribution.

The neural network 600 is trained, for example, similarly to the neural network 300.

Figure 7:
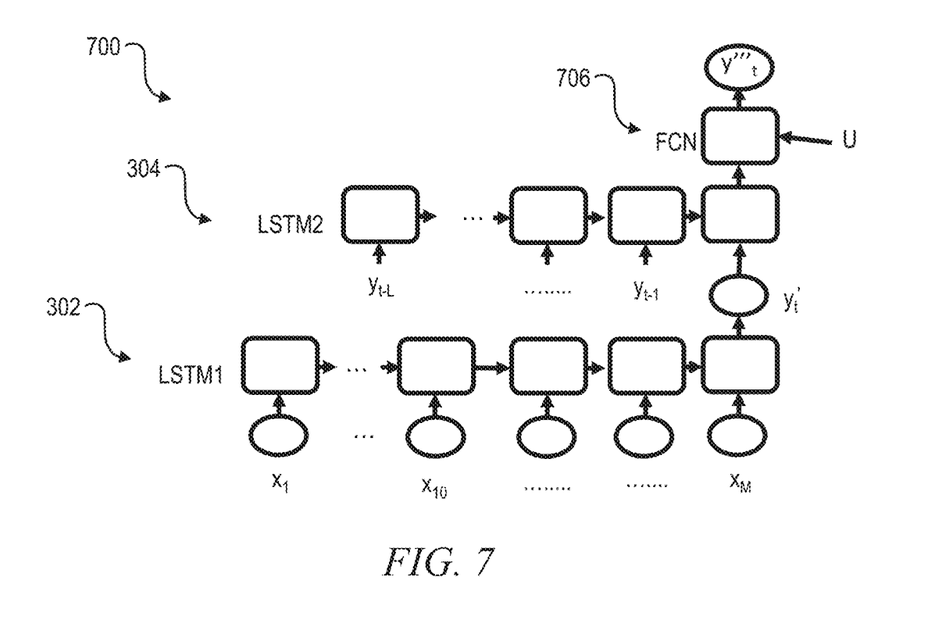
FIG. 7 depicts in a schematic a neural network according to an exemplary embodiment.

FIG. 7 depicts in a schematic another neural network 700 that is used for predicting a post-process measurement or target variable from in-process sensor signals $x_1 \ldots x_{10} \ldots x_M$ for a single process step in combination with a signal U that is external to the process, according to an exemplary embodiment. For example, the process step could be lithography while the external signal could be a critical dimension of the wafer entering the process step. The neural network 700 includes the first LSTM layer 302, the second LSTM layer 304, and a fully connected layer (FCN) 706. The neural network 700 differs from the neural network 300 in that the FCN 706 is configured to accept as input not only the output of the second LSTM layer 304, but also a value U for the external signal.

The neural network 700 is trained, for example, similarly to the neural networks 300 or 600. Additionally, the FCN 306 is trained with the historical measurement $y_i$ as desired output and with the external signal value U and the historical prediction $y'_i$ as input.

Thus, one or more embodiments learn a distribution of a target variable Y from historical measurements of the target variable in combination with in-process sensor data X:

$$Y_t = g(X_t, y_{t-1}, y_{t-2}, \ldots, y_{t-L})$$

Such embodiments model a conditional distribution of $Y_t$, $$P(Y_t | X_t, y_{t-1}, y_{t-2}, \ldots, y_{t-L}),$$

as a Gaussian mixture:

$$\mathbb{P}(y_t | X_t, y_{t-1 \to}) = \sum_{i=1}^{K} \pi_i \mathcal{N}(y_t | \mu_i(X_t, y_{t-1 \to}), \sigma_i^2(X_t, y_{t-1 \to})).$$

Figure 8:
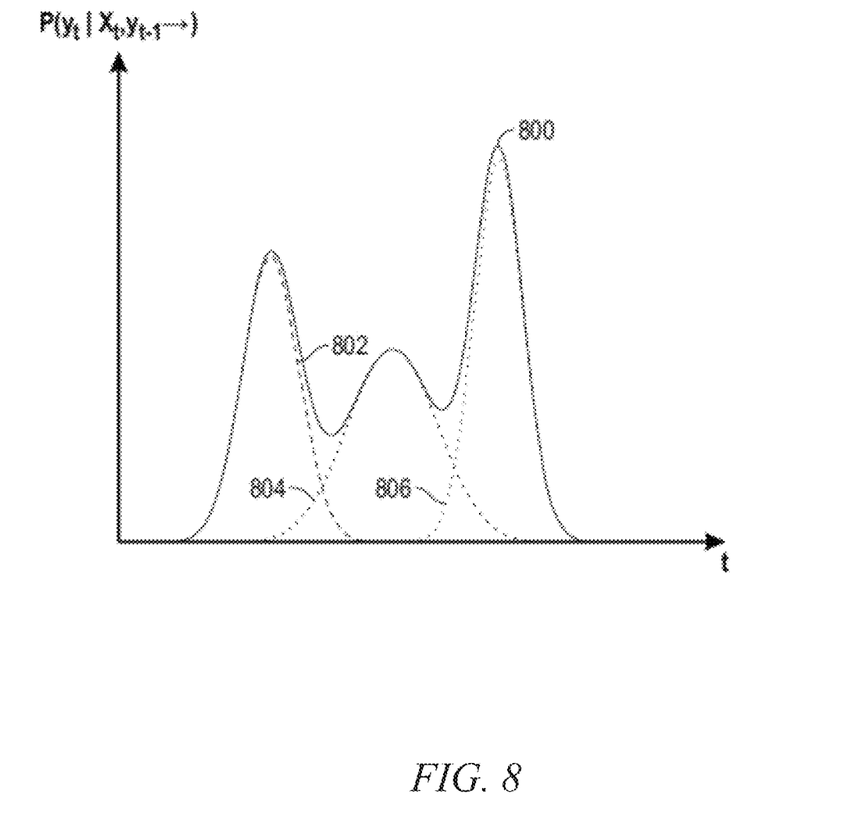
FIG. 8 depicts an exemplary probability distribution.

FIG. 8 depicts in a solid line an exemplary Gaussian mixture probability distribution 800. The dashed lines indicate single Gaussian distributions 802, 804, 806. The mixture Gaussian 800 is composed of the three single Gaussians.

Figure 9:
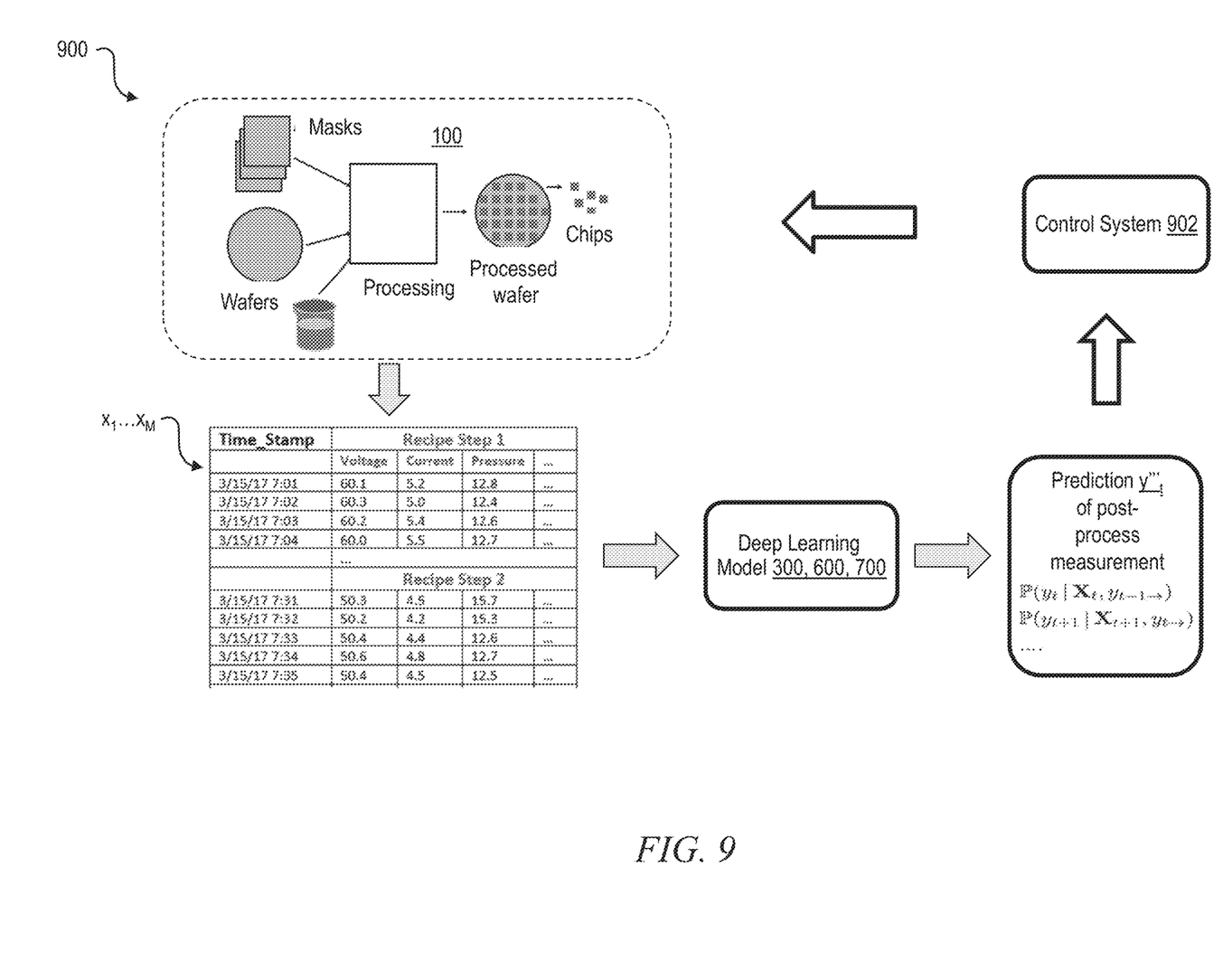
FIG. 9 depicts in a schematic a control process according to an exemplary embodiment.

FIG. 9 depicts in a schematic an overview of a control process 900 that is implemented according to an exemplary embodiment. From the manufacturing process flow 100 of FIG. 1, in-process measurements $x_t \ldots x_M$ are obtained in real-time (as at 202 in FIG. 2). A deep learning model (e.g., neural network 300, 600, or 700) is applied to the in-process measurements to produce a prediction $y'''_t$ of the post-process measurement (target variable) (as at 204 in FIG. 2). The prediction $y'''_t$ is fed into a control system 902, which adjusts the manufacturing process flow 100 in real-time (as at 206 in FIG. 2), in an effort to make the target variable approach a desired value. In one or more embodiments, the control system 902 may adjust a process parameter that has been empirically demonstrated to effect a change in the post-process measurement. For example, the process parameter may be adjusted according to an empirical error function for one or more of the in-process measurements relative to the process parameter. Alternatively, the process parameter may be adjusted according to an empirical error function for the post-process measurement relative to the process parameter. In one or more embodiments, further in-process measurements may be obtained and the learning model 300, 600, or 700 may be applied again to get a new prediction that may result in a new adjustment to the process parameter. In one or more embodiments, a human expert may be involved in operating the control system 902 for the adjustment of the process parameter.

Thus, based on the predictions produced by embodiments of the invention, a manufacturing process operator obtains an enhanced understanding of whether a process outcome is likely to match the desired specification. In case the process outcome is not likely to match the specification, embodiments of the invention enable the process operator to adjust the process in real-time (i.e. while the process is going on).

Given the discussion thus far, it will be appreciated that, in general terms, an exemplary method for controlling a manufacturing process in real-time during a current process step of the manufacturing process, according to an aspect of the invention, includes at 502 obtaining historical post-process measurements Y taken on prior products of the manufacturing process; at 504 obtaining historical in-process measurements X taken on prior workpieces during prior iterations of the current process step; at 506 training a neural network to predict at least one of the historical post-process measurements in response to the corresponding historical in-process measurements and in response to a subset of the historical post-process measurements that preceded the at least one of the historical post-process measurements to be predicted; at 202 obtaining present in-process measurements on a present workpiece during the current process step; at 204 predicting a future post-process measurement for the present workpiece, by providing the present in-process measurements and the historical post-process measurements as inputs to the neural network; and at 206 adjusting at least one controllable variable of the manufacturing process in response to the prediction of the future post-process measurement.

In one or more embodiments, the neural network incorporates a first long short term memory layer 302 that takes as inputs in-process measurements X from a present process step, and that produces as an output a (first) naïve prediction $y'_t$ of the future post-process measurement. Additionally, the neural network may incorporate a second long short term memory layer 304 that takes as inputs historical post-process measurements $y_{t-L}, \ldots y_{t-1}$ and the (first) naïve prediction $y'_t$ of the post-process measurement, and that produces as an output an informed prediction $y'''_t$ of the future post-process measurement. Alternatively, the neural network may incorporate a second long short term memory layer 603 that takes as inputs in-process measurements $z_1 \ldots z_{10} \ldots z_S$ from a previous process step, and that produces as an output a second naïve prediction $y''_t$ of the future post-process measurement. In one or more embodiments, the neural network incorporates a third long short term memory layer 604 that takes as inputs the first naïve prediction, the second naïve prediction, and historical post-process measurements, and that produces as an output an informed prediction $y'''_t$ of the future post-process measurement.

In one or more embodiments, adjusting the at least one controllable variable includes repeatedly obtaining at least one in-process measurement and predicting the future post-process measurement. For example, steps 202 . . . 206 may be repeated during implementation of a process step. In one or more embodiments, adjusting the at least one controllable variable includes changing the at least one controllable variable consistent with an empirical error function for the post-process measurement relative to the at least one controllable variable.

One or more embodiments of the invention, or elements thereof, can be implemented in the form of an apparatus including a memory and at least one processor that is coupled to the memory and operative to facilitate exemplary method steps, or in the form of a non-transitory computer readable medium embodying computer executable instructions which when executed by a computer cause the computer to facilitate exemplary method steps.

Figure 10:
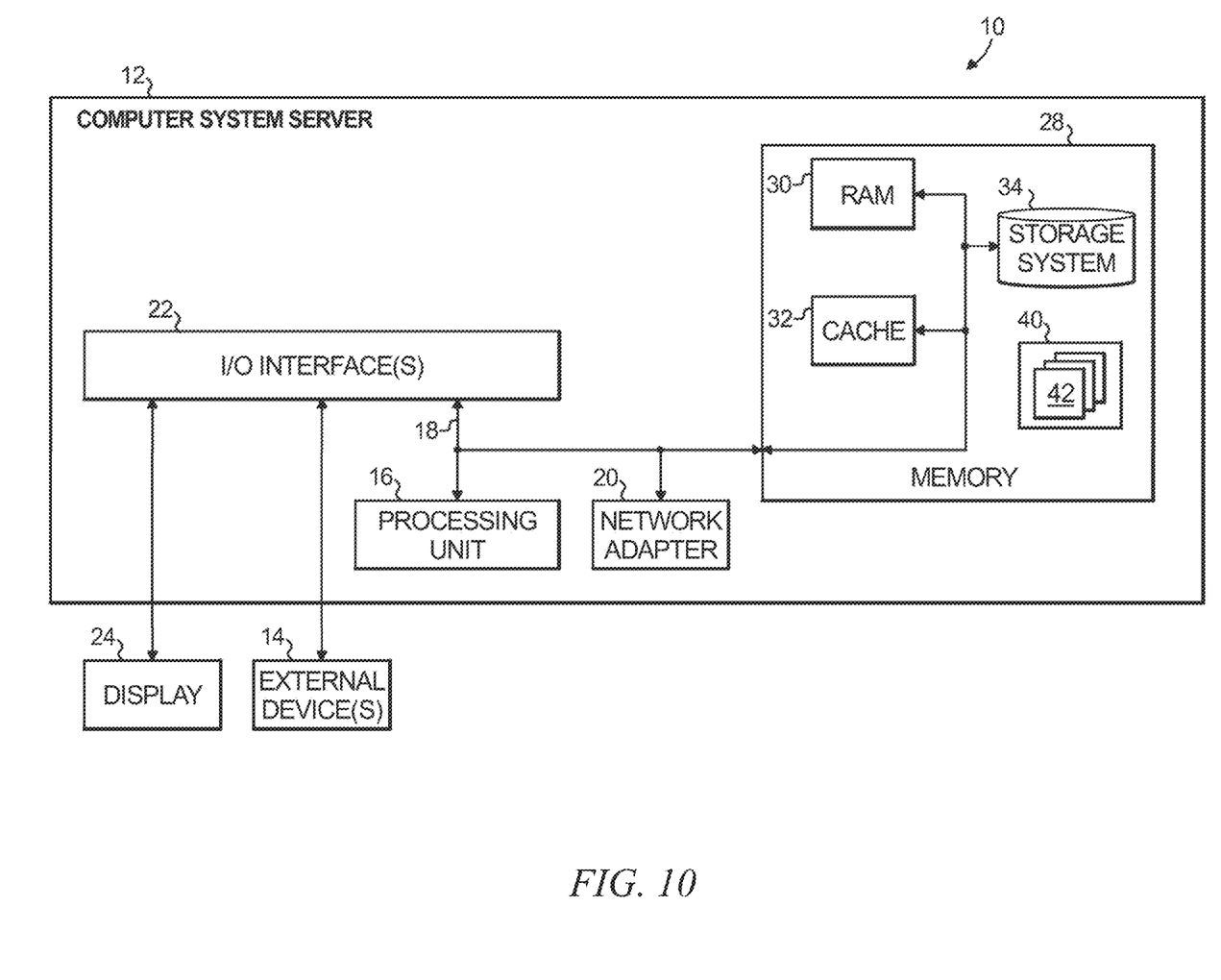
FIG. 10 depicts a computer system that may be useful in implementing one or more aspects and/or elements of the invention.

FIG. 10 depicts a process control system 10 that may be useful in implementing one or more aspects and/or elements of the invention. In manufacturing process control system 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 12 in manufacturing process control system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices such as semiconductor fab tool chamber controllers. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, and external disk drive arrays, RAID systems, tape drives, and data archival storage systems, etc. Process control could also occur via network adapter 20 in some instances.

Thus, one or more embodiments can make use of software running on a general purpose computer or workstation. With reference to FIG. 10, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 10) running a server program. It will be understood that such a physical server may or may not include a display and keyboard.

One or more embodiments can be at least partially implemented in the context of a cloud or virtual machine environment, although this is exemplary and non-limiting.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for controlling a manufacturing process in real-time during a current process step of the manufacturing process, the method comprising:
    obtaining historical post-process measurements taken on prior products of the manufacturing process;
    obtaining historical in-process measurements taken on prior workpieces during prior iterations of the current process step;
    training a neural network to predict at least one of the historical post-process measurements in response to the corresponding historical in-process measurements and in response to a subset of the historical post-process measurements that preceded the at least one of the historical post-process measurements to be predicted;
    obtaining present in-process measurements on a present workpiece during the current process step;
    predicting a future post-process measurement for the present workpiece, by providing the present in-process measurements and the historical post-process measurements as inputs to the neural network, wherein predicting the future post-process measurement comprises a first long short term memory layer taking as inputs the present in-process measurements, and producing as an output a naïve prediction of the future post-process measurement, wherein predicting the future post-process measurement also comprises a second long short term memory layer taking as inputs historical post-process measurements and the naïve prediction of the post-process measurement, and passing an output to a fully connected layer which produces an informed prediction of the future post-process measurement; and
    adjusting at least one controllable variable of the manufacturing process in response to the prediction of the future post-process measurement.

2. The method of claim 1 wherein adjusting the at least one controllable variable includes repeatedly obtaining at least one in-process measurement and predicting the future post-process measurement.

3. The method of claim 1 wherein adjusting the at least one controllable variable includes changing the at least one controllable variable consistent with an empirical error function for the future post-process measurement relative to the at least one controllable variable.

4. A method for controlling a manufacturing process in real-time during a current process step of the manufacturing process, the method comprising:
    obtaining historical post-process measurements taken on prior products of the manufacturing process;
    obtaining historical in-process measurements taken on prior workpieces during prior iterations of the current process step;
    training a neural network to predict at least one of the historical post-process measurements in response to the corresponding historical in-process measurements and in response to a subset of the historical post-process measurements that preceded the at least one of the historical post-process measurements to be predicted;

obtaining present in-process measurements on a present workpiece during the current process step;

predicting a future post-process measurement for the present workpiece, by providing the present in-process measurements and the historical post-process measurements as inputs to the neural network; and adjusting at least one controllable variable of the manufacturing process in response to the prediction of the future post-process measurement, wherein predicting the future post-process measurement comprises a first long short term memory layer taking as inputs the present in-process measurements, and producing as an output a first naïve prediction of the future post-process measurement, and wherein the neural network incorporates a second long short term memory layer that takes as inputs in-process measurements from a previous process step that preceded the current process step on the present workpiece, and that produces as an output a second naïve prediction of the future post-process measurement, and wherein the neural network further incorporates a third long short term memory layer that takes as inputs the first naïve prediction, the second naïve prediction, and historical post-process measurements and that passes an output to a fully connected layer which produces as an output an informed prediction of the future post-process measurement.

5. A non-transitory computer readable medium embodying computer executable instructions which when executed by a computer cause the computer to facilitate a method for controlling a manufacturing process in real-time during a current process step of the manufacturing process, the method comprising:

obtaining historical post-process measurements taken on prior products of the manufacturing process;

obtaining historical in-process measurements taken on prior workpieces during prior iterations of the current process step;

training a neural network to predict at least one of the historical post-process measurements in response to the corresponding historical in-process measurements and in response to a subset of the historical post-process measurements that preceded the at least one of the historical post-process measurements to be predicted;

obtaining present in-process measurements on a present workpiece during the current process step;

predicting a future post-process measurement for the present workpiece, by providing the present in-process measurements and the historical post-process measurements as inputs to the neural network, wherein predicting the future post-process measurement comprises a first long short term memory layer taking as inputs the present in-process measurements, and producing as an output a naïve prediction of the future post-process measurement, wherein predicting the future post-process measurement also comprises a second long short term memory layer taking as inputs historical post-process measurements and the naïve prediction of the post-process measurement, and passing an output to a fully connected layer which produces an informed prediction of the future post-process measurement; and adjusting at least one controllable variable of the manufacturing process in response to the prediction of the future post-process measurement.

6. The method of claim 5 wherein adjusting the at least one controllable variable includes repeatedly obtaining at least one in-process measurement and predicting the future post-process measurement.

7. A non-transitory computer readable medium embodying computer executable instructions which when executed by a computer cause the computer to facilitate a method for controlling a manufacturing process in real-time during a current process step of the manufacturing process, the method comprising:

obtaining historical post-process measurements taken on prior products of the manufacturing process;

obtaining historical in-process measurements taken on prior workpieces during prior iterations of the current process step;

training a neural network to predict at least one of the historical post-process measurements in response to the corresponding historical in-process measurements and in response to a subset of the historical post-process measurements that preceded the at least one of the historical post-process measurements to be predicted;

obtaining present in-process measurements on a present workpiece during the current process step;

predicting a future post-process measurement for the present workpiece, by providing the present in-process measurements and the historical post-process measurements as inputs to the neural network; and adjusting at least one controllable variable of the manufacturing process in response to the prediction of the future post-process measurement, wherein predicting the future post-process measurement comprises a first long short term memory layer taking as inputs the present in-process measurements, and producing as an output a first naïve prediction of the future post-process measurement, and wherein the neural network incorporates a second long short term memory layer that takes as inputs in-process measurements from a previous process step that preceded the current process step on the present workpiece, and that produces as an output a second naïve prediction of the future post-process measurement, and wherein the neural network further incorporates a third long short term memory layer that takes as inputs the first naïve prediction, the second naïve prediction, and historical post-process measurements and that passes an output to a fully connected layer which produces as an output an informed prediction of the future post-process measurement.

8. A process control system comprising:

a memory embodying computer executable instructions; and at least one processor, coupled to the memory, and operative by the computer executable instructions to facilitate a method for controlling a manufacturing process in real-time during a current process step of the manufacturing process, the method comprising:

obtaining historical post-process measurements taken on prior products of the manufacturing process;

obtaining historical in-process measurements taken on prior workpieces during prior iterations of the current process step;

training a neural network to predict each of the historical post-process measurements in response to the corresponding historical in-process measurements and in response to a subset of the historical post-process measurements that preceded the at least one of the historical post-process measurements to be predicted;

obtaining present in-process measurements on a present workpiece during the current process step;

predicting a future post-process measurement for the present workpiece, by providing the present in-process measurements and the historical post-process measurements as inputs to the neural network, wherein predicting the future post-process measurement comprises a first long short term memory layer taking as inputs the present in-process measurements, and producing as an output a naïve prediction of the future post-process measurement, wherein predicting the future post-process measurement also comprises a second long short term memory layer taking as inputs historical post-process measurements and the naïve prediction of the post-process measurement, and passing an output to a fully connected layer which produces an informed prediction of the future post-process measurement; and adjusting at least one controllable variable of the manufacturing process in response to the prediction of the future post-process measurement.

9. The system of claim 8 wherein adjusting the at least one controllable variable includes repeatedly obtaining at least one in-process measurement and predicting the future post-process measurement.

10. The system of claim 9 wherein adjusting the at least one controllable variable includes changing the at least one controllable variable consistent with an empirical error function for the post-process measurement relative to the at least one controllable variable.

11. A process control system comprising:
  a memory embodying computer executable instructions; and
  at least one processor, coupled to the memory, and operative by the computer executable instructions to facilitate a method for controlling a manufacturing process in real-time during a current process step of the manufacturing process, the method comprising:
    obtaining historical post-process measurements taken on prior products of the manufacturing process;
    obtaining historical in-process measurements taken on prior workpieces during prior iterations of the current process step;
    training a neural network to predict each of the historical post-process measurements in response to the corresponding historical in-process measurements and in response to a subset of the historical post-process measurements that preceded the at least one of the historical post-process measurements to be predicted;
    obtaining present in-process measurements on a present workpiece during the current process step;
    predicting a future post-process measurement for the present workpiece, by providing the present in-process measurements and the historical post-process measurements as inputs to the neural network; and
    adjusting at least one controllable variable of the manufacturing process in response to the prediction of the future post-process measurement, wherein predicting the future post-process measurement comprises a first long short term memory layer taking as inputs the present in-process measurements, and producing as an output a first naïve prediction of the future post-process measurement, and wherein the neural network incorporates a second long short term memory layer that takes as inputs in-process measurements from a previous process step that preceded the current process step on the present workpiece, and that produces as an output a second naïve prediction of the future post-process measurement, and wherein the neural network further incorporates a third long short term memory layer that takes as inputs the first naïve prediction, the second naïve prediction, and historical post-process measurements and that passes an output to a fully connected layer which produces as an output an informed prediction of the future post-process measurement.

\* \* \* \* \*